United States Patent
Kim et al.

(10) Patent No.: US 7,727,826 B2
(45) Date of Patent: Jun. 1, 2010

(54) METHOD FOR MANUFACTURING A SEMICONDUCTOR DEVICE

(75) Inventors: Joong Sik Kim, Goyang-si (KR); Sung Woong Chung, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/327,362

(22) Filed: Dec. 3, 2008

(65) Prior Publication Data

US 2009/0298242 A1     Dec. 3, 2009

(30) Foreign Application Priority Data

May 28, 2008   (KR) .................. 10-2008-0049894

(51) Int. Cl.
*H01L 21/00* (2006.01)
*H01L 21/84* (2006.01)

(52) U.S. Cl. .................. 438/164; 438/151; 257/347

(58) Field of Classification Search ............... 438/151, 438/164, 595; 257/347, E21.409, E21.415
See application file for complete search history.

(56) References Cited

U.S. PATENT DOCUMENTS 6,589,827 B2 *   7/2003   Kubo et al. ............... 438/157
6,635,517 B2 *   10/2003  Chen et al. ............... 438/143
2005/0054169 A1 *  3/2005  Wagner et al. ........... 438/311

FOREIGN PATENT DOCUMENTS

JP    09-219523 A      8/1997
KR    2003-0059391     7/2003

* cited by examiner

*Primary Examiner*—Phuc T Dang
(74) *Attorney, Agent, or Firm*—Marshall, Gerstein & Borun LLP

(57) ABSTRACT

Disclosed herein is a method for manufacturing a semiconductor device that includes forming a gate pattern on a substrate having a stacked structure including a lower silicon layer, an insulating layer, and an upper silicon layer. The method further includes forming spacers on sidewalls of the gate pattern. Still further, the method includes etching the upper silicon layer using the gate pattern as a mask to form a floating body and expose a portion of the insulating layer. The method further includes depositing a conductive layer over the gate pattern and exposed insulating layer, and performing a thermal process on the conductive layer to form a source/drain region in the floating body.

19 Claims, 6 Drawing Sheets

METHOD FOR MANUFACTURING A SEMICONDUCTOR DEVICE

CROSS-REFERENCE TO RELATED APPLICATION

Priority to Korean patent application No. 10-2008-0049894, filed on May 28, 2008, the disclosure of which is incorporated herein by reference in its entirety, is claimed.

BACKGROUND OF THE INVENTION

1. Field of the Disclosure

The invention generally relates to a method for fabricating a semiconductor device, and, more particularly, to a method for forming a semiconductor device having a floating body transistor.

2. Brief Description of Related Technology

A semiconductor memory apparatus is configured to store data generated or processed therein. For example, if a request from a data processor, such as a central processing unit (CPU), is received, the semiconductor memory apparatus outputs data to the data processor from unit cells therein or stores data processed by the data processor to the unit cells according to an address transmitted with the request.

The data storage capacity of semiconductor memory apparatuses has increased without a corresponding increase in the size of the semiconductor memory apparatus. The sizes of various components and elements for read or write operations have also been reduced. Unnecessary, duplicate components and elements in the semiconductor memory apparatus, such as transistors or wires, are combined or merged to decrease the area occupied by each component. A reduction of the size of unit cells included in the semiconductor memory apparatus affects improvement of integration because the unit cells occupy one of the largest areas therein.

For example, in a Dynamic Random Access Memory (DRAM) device, a type of volatile memory device configured to retain data while a power source is supplied, the unit cell comprises a transistor and a capacitor. After the data "1" is delivered to the capacitor, charges temporarily stored in a storage node dissipate, i.e., amount of the charges is decreased, as a result of both leakage currents generated at the junction of the storage nodes and instinctive characteristics of the capacitor. As a result, performance of a refresh operation on the unit cells is periodically required to prevent destruction of the data on the DRAM device.

Numerous methods for increasing capacitance (Cs) of the capacitor included in the unit cell have been suggested, which would allow for a larger amount of charges to be stored in the storage node. For example, the typical oxide film used as the insulating film of the capacitor can be replaced with an advanced insulating film, which has a larger dielectric constant, such as, for example, a nitrified oxide film or a high dielectric film. Alternatively, the typical two-dimensional capacitor structure can be replaced with a three-dimensional cylindrical structure or a trench structure, which can increase the surface area of both of the electrodes of the capacitor.

As the design rule is reduced, the area in which a capacitor can be formed is also reduced, and it is difficult to develop suitable insulating film materials for the capacitor. As a result of the reduced capacitor area, a junction resistance value of the storage node and a turn-on resistance value of the transistor in the unit cell are increased, making it difficult to perform normal read and write operations, and deteriorating refresh characteristics.

In order to improve the above-described shortcomings, the unit cell can include a transistor having a floating body, and the capacitor can be eliminated. Data is stored in a floating body of the transistor, rather than a capacitor.

Data is stored in the floating body by reducing a voltage level supplied on the word line to ½ or ⅓ of the voltage level applied to the bit line connected to one active region of the transistor, to thereby generate hot carriers. When the data "1" is delivered, a large amount of hot carriers are generated in a junction region of the bit lines. Then, electrons are sent out into the bit line, while the holes remain in the floating body. When the data "0" is transmitted, hot carriers are not generated in the junction region, and the holes do not remain in the floating body. Storage of holes in the floating body lowers the threshold voltage of the transistor of the unit cell. As a result, the amount of a current flowing through the transistor increases. That is, the amount of the current flowing when the holes are stored in the floating body is larger than that flowing when holes are not stored. As a result, it is possible to distinguish whether the data "1" or "0" is stored in the unit cell.

Although elimination of the capacitor improves integration of the semiconductor memory apparatus, a leakage current that occurs at a source line junction and/or bit line junction makes it difficult to prevent reduction of the amount of holes stored in the floating body. Generally, the active region (i.e., the source and/or drain regions) of the transistor, which is connected to the bit line or the source line, includes a high concentration of impurities to reduce resistance resulting from the junction with the metal lines. However, the amount of leakage current between the active region and the floating body can increase if the active region is doped with a high concentration of impurities. As a result, the amount of holes stored in the floating body can dissipate over time. The amount of the leakage current also increases proportionally to temperature increases. As a result, data stored in the transistor of the unit cell is easily deleted under high temperature conditions.

In order to maximize the cell packing density, it is advantageous to isolate cells in the single active region than to separate unit cells through an isolation film formed by a shallow trench isolation (STI) process performed on a floating body transistor formed over a SOI semiconductor substrate. However, because the distance between the source and drain regions of the transistor having a channel region is decreased to reduce the overall size of the transistor, it is difficult to prevent a short channel effect, such as the punch-through phenomenon. The punch-through phenomenon more frequently occurs in the lower portion of the floating body than in the upper portion of the floating body, because the channel doping concentration increases from the bottom of the gate pattern to the top thereof. Furthermore, it is necessary to maximize the capacity of the body so that the floating body transistor may store more holes in the floating body corresponding to data.

In order to prevent a short channel effect, a local doping region is generally formed in the floating body through an ion-implanting process. However, due to the reduction of the design rule, it is difficult to precisely form the local doping region in an expected region of the floating body through the ion-implanting process. As a result, it is difficult to prevent the short channel effect including the punch-through phenomenon of the floating body transistor, which can degrade the reliability of the semiconductor device.

SUMMARY OF THE INVENTION

Various embodiments of the invention are directed to a method for manufacturing a semiconductor device that can prevent an excessive out-diffusion phenomenon of a floating body during a thermal treatment process for forming source/drain regions. Further embodiments are directed to a method of manufacturing a semiconductor device that can prevent a short channel effect, such as a punch-through phenomenon, that may be generated in the lower portion of the floating body due to a reduction of the design rule.

In an embodiment of the invention, a method for manufacturing a semiconductor device includes forming a gate pattern on a substrate having a stacked structure including a lower silicon layer, an insulating layer, and an upper silicon layer. The method further includes forming spacers sidewalls of the gate pattern. The spacers can include a nitride layer. Still further, the method includes etching the upper silicon layer using the gate pattern as an etching mask to form a floating body and expose a portion of the insulating layer. The upper silicon layer can be etched, for example, using an etch-back process. The method also includes forming a conductive layer over the gate pattern, floating body, and the exposed insulating layer, and performing a thermal process on the conductive layer to form a source/drain region in the floating body. Preferably, the conductive layer includes a doped polysilicon layer, and the thermal process diffuses dopants from the doped polysilicon layer into the floating body.

The method can further include forming a gate oxide layer on the upper silicon layer before forming the gate pattern.

The method can also further include forming an oxide layer over the gate pattern including the spacers.

The method can further include forming an undoped polysilicon layer on the gate pattern, including the spacers, the floating body, and the exposed buried insulating layer before forming the conductive layer. The polysilicon layer can have a thickness, for example, of about 50 Å to about 200 Å.

In another embodiment of the invention, a method for manufacturing a semiconductor apparatus includes forming a gate pattern on a silicon on insulator (SOI) substrate having a stacked structure including a lower silicon layer, an insulating layer, and an upper silicon layer. The method further includes etching the upper silicon layer to form a floating body under the gate pattern. Preferably, the upper silicon layer is etched using an etch-back process. Still further, the method includes forming an undoped polysilicon layer on the gate pattern and the floating body, and forming a conductive layer on the undoped polysilicon layer. A thermal process is then performed on the conductive layer to form a source/drain region. Preferably, the conductive layer is a doped polysilicon layer, and the thermal process diffuses dopants into the undoped polysilicon layer and the floating body.

The method can include forming the gate pattern by forming a gate electrode including a polysilicon layer and a metal layer on the SOI substrate; forming a gate hard mask layer on the gate electrode; and forming a spacer on sidewalls of the gate electrode and the gate hard mask layer. Preferably, the spacer includes a nitride layer.

The method can further include forming a gate oxide layer on the SOI substrate before forming the gate pattern. The method can also further include forming an oxide film on the gate pattern; etching the gate oxide layer using the gate pattern as a mask to expose a portion of the upper silicon layer, and removing the oxide layer before etching the upper silicon layer.

Preferably, the undoped polysilicon layer has a thickness in range of from 50 Å to 200 Å. The thickness of the undoped polysilicon layer depends on the time and temperature of the thermal process and the dopant density of the doped polysilicon layer.

BRIEF DESCRIPTION OF THE DRAWINGS

For a more complete understanding of the disclosure, reference should be made to the following detailed description and accompanying drawings.

Figure 1A:
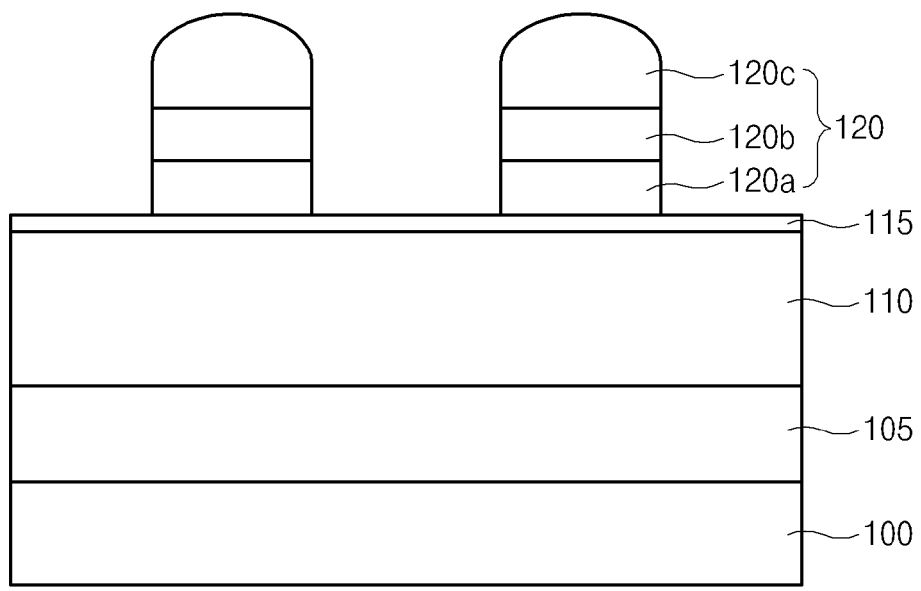
FIGS. 1a to 1f are cross-sectional diagrams illustrating a method for fabricating a floating body transistor in a semiconductor device according to an embodiment of the invention.

While the disclosed method is susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DETAILED DESCRIPTION OF EMBODIMENTS

A semiconductor device typically comprises a plurality of unit cells, a plurality of word lines for activating the unit cells, and a plurality of bit lines for transmitting data to the unit cells. The unit cell includes a transistor having a floating body.

Referring to FIG. 1a, a gate pattern 120 is formed over an upper silicon layer 110 of a SOI semiconductor substrate. A gate oxide film 115 can be formed over the upper silicon layer 110 of the SOI semiconductor substrate before forming the gate pattern 120.

The gate pattern 120 includes a gate electrode having a polysilicon layer 120a and a metal layer 120b, and a hard mask 120c for protecting the gate electrode.

The SOI semiconductor substrate includes a lower silicon layer 100, an insulating layer 105 formed over the lower silicon layer 100, and an upper silicon layer 110 formed over the insulating layer 105. The insulating layer 105 can be, for example, a thermal oxide film. In the SOI wafer, a buried insulating film is artificially formed between the upper silicon layer 110 and the lower silicon layer 100 included in the base unit, thereby facilitating electronic isolation between neighboring elements formed on upper silicon layer 110 and reducing electrostatic capacity of the upper silicon layer 110 as compared with a bulk silicon substrate. As a result, the efficiency of processing the upper silicon layer 110 of high purity formed over the insulating layer 105 can be increased, and characteristics of the devices formed in the upper silicon layer 110 can also be improved.

Figure 1B:
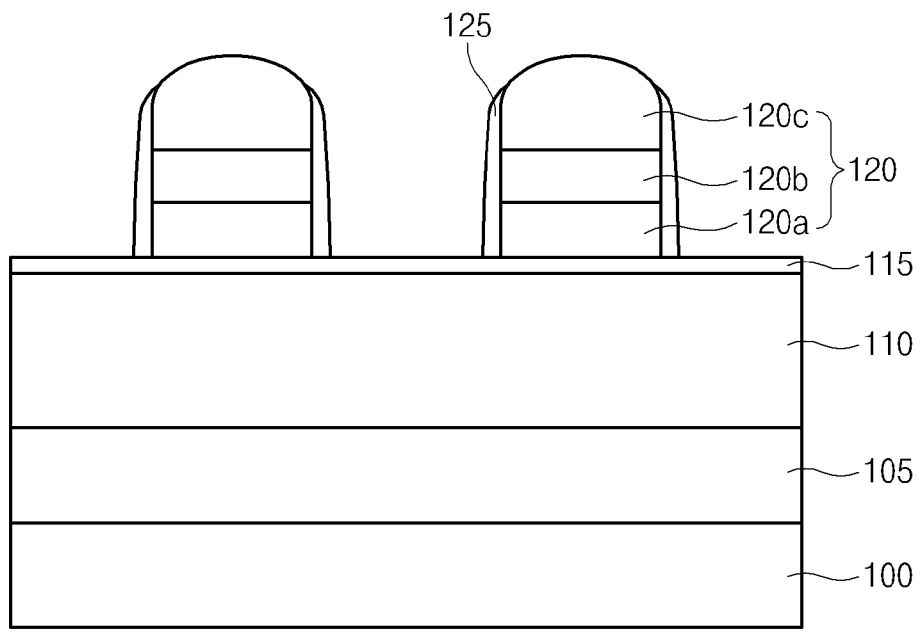
Figure 1C:
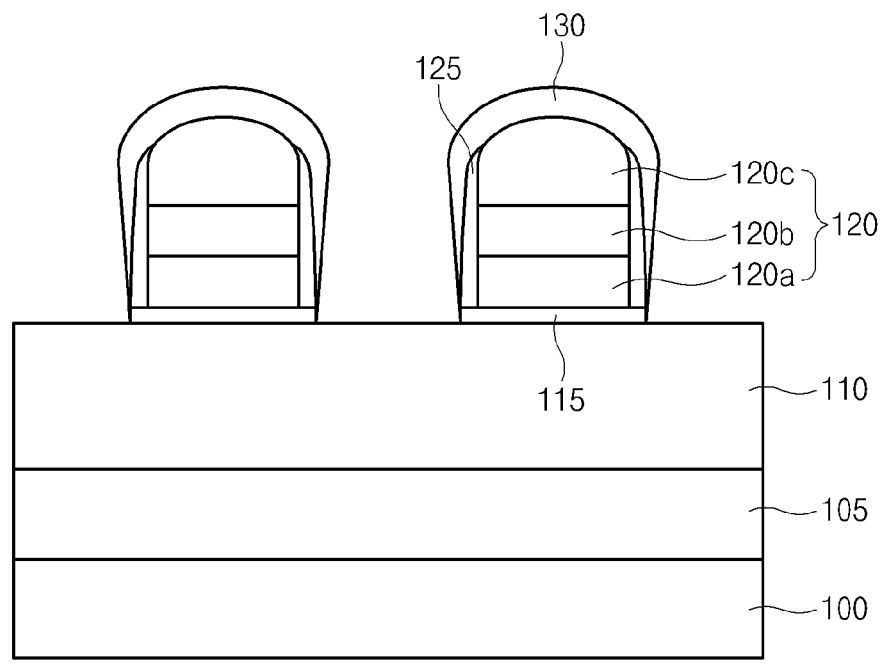

Referring to FIG. 1b, a spacer 125 is formed on each sidewall of the gate pattern 120. In the spacers 125 can include, for example, a nitride layer. Referring to FIG. 1c, an oxide film 130 for protecting the gate pattern 120 can then be formed over the gate pattern 120. The oxide film 130 is, preferably, formed by forming an oxide layer uniformly over the gate pattern 120 include the spacers 125. Then a self-aligned etching process is performed on the oxide layer to form the oxide film 130. Preferably, the oxide film 130 has a cap shape for protecting the upper portion of the gate pattern 120, as shown in FIG. 1c.

The gate oxide film 115 can then be etched using the gate pattern 120 as an etching mask to expose a portion of the upper silicon layer 110. For example, the gate oxide film 115 can be etched using an etch back process.

Figure 1D:
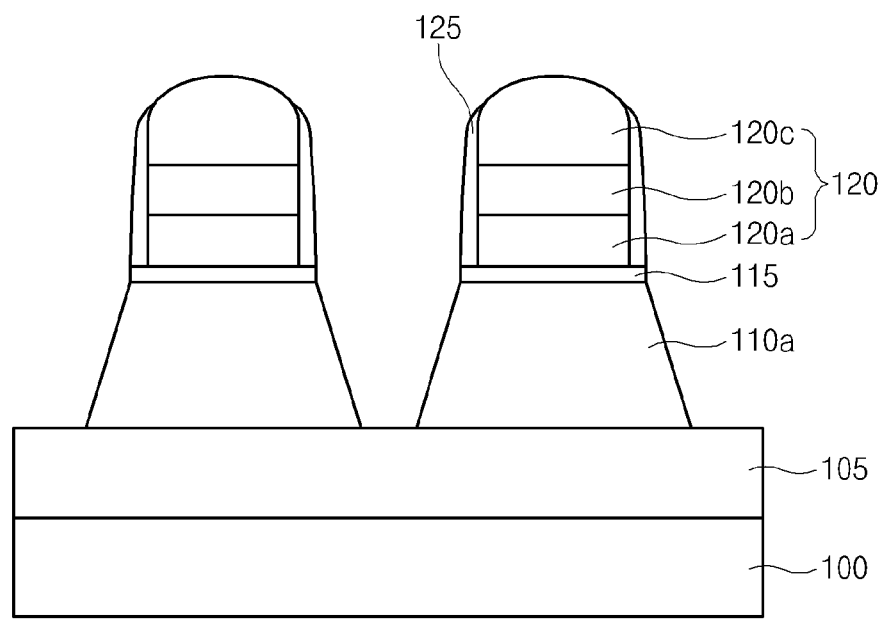

Referring to FIG. 1d, after the oxide film 130 is removed, the exposed upper silicon layer 110 is etched using the gate pattern 120 as an etching mask to expose a portion of the insulating layer 105. As a result, a floating body 110a having, for example, a trapezoid shape, is formed at the bottom of the gate pattern 120. The trapezoidal floating body 110a includes sidewalls that are not vertically aligned with the sidewalls of the gate pattern 120. Rather the insulating layer 105 is etched slant-wise so that the lower portion of the floating body 110a is broader than the upper portion of the floating body 110a. The slant-wise etching of the insulating layer 105 can occur generally when a material deposited between narrow patterns is etched. Thus, it can be unnecessary to etch the sidewall of the floating body 110a with the enhanced etching condition. It may be sufficient to expose the insulating layer 105 and isolate the floating body 110a that remains in the bottom of gate pattern 120. In general, the capacity of the floating body 110a increases as the inclination of the sidewall of the floating body 110a becomes more gradual, which can make it easier to prevent the punch-through phenomenon at the bottom of the floating body 110a having a lower doping concentration.

Figure 1E:
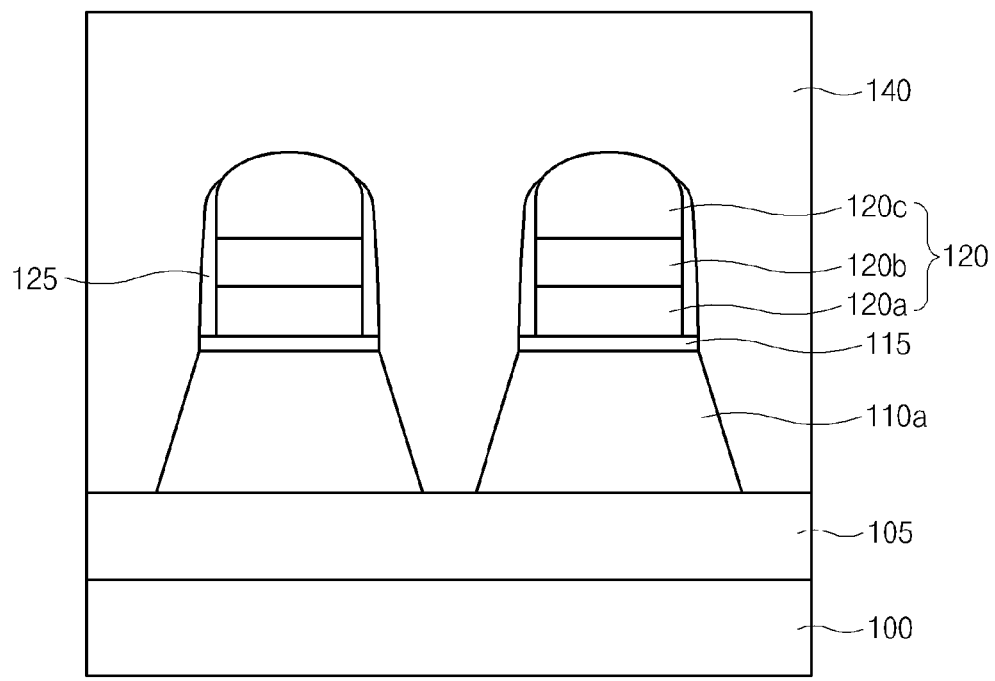

Referring to FIG. 1e, a conductive layer 140, for forming a source/drain region 150 and a plug is formed over and is in contact with the gate pattern 120 and the floating body 110a. The conductive layer 140 can be, for example, a doped polysilicon layer.

Figure 1F:
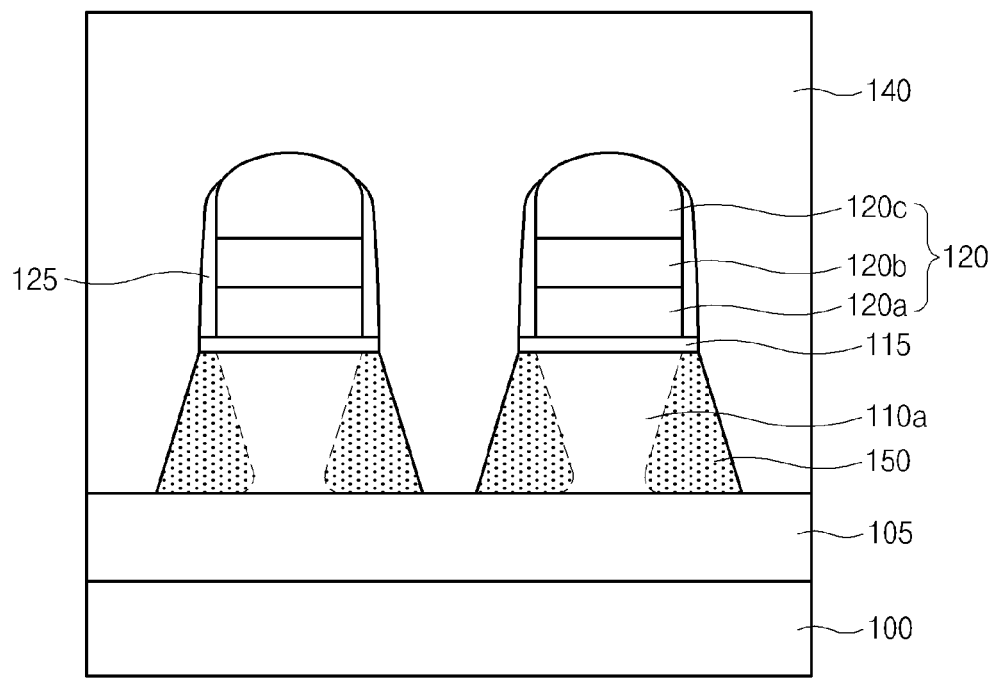

Referring to FIG. 1f, when a doped polysilicon layer is used, the dopants of polysilicon layer 140 can be diffused in a horizontal direction into the floating body 110a using, for example, a thermal treatment. Diffusion of the dopants into the floating body 110a isolates the transistor and defines source and drain regions 150 of each transistor. Thus, an ion-implanting process is performed to fabricate a floating body transistor without forming a local doping region in the floating body 110a.

Figure 2A:
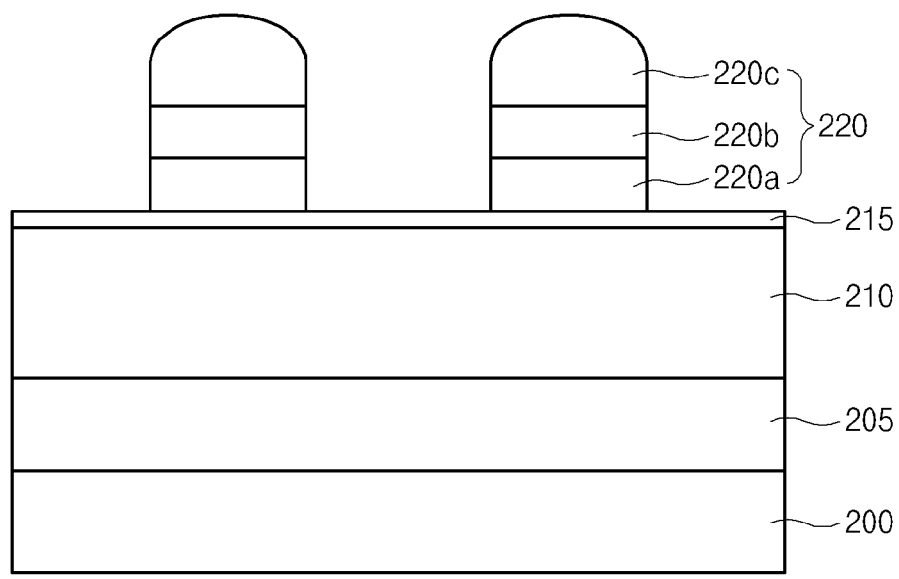
FIGS. 2a to 2f are cross-sectional diagrams illustrating a method for fabricating a floating body transistor in a semiconductor device according to another embodiment of the invention.

Referring to FIG. 2a, a method of forming a semiconductor device in accordance with another embodiment of the invention includes forming a gate pattern 220 over an upper silicon layer 210 of a SOI semiconductor substrate. A gate oxide layer 215 can be formed over the upper silicon layer 210 before forming the gate pattern 220.

The SOI semiconductor substrate includes a lower silicon layer 200, an insulating layer 205 formed over the lower silicon layer 200, and an upper silicon layer 210 formed over the insulating layer 205. The insulating layer 205, can be, for example, a thermal oxide film.

The gate pattern 220 that includes a gate electrode having a polysilicon layer 220a and a metal layer 220b, and a hard mask 220c for protecting the gate electrode is formed over the upper gate oxide film 215.

Figure 2B:
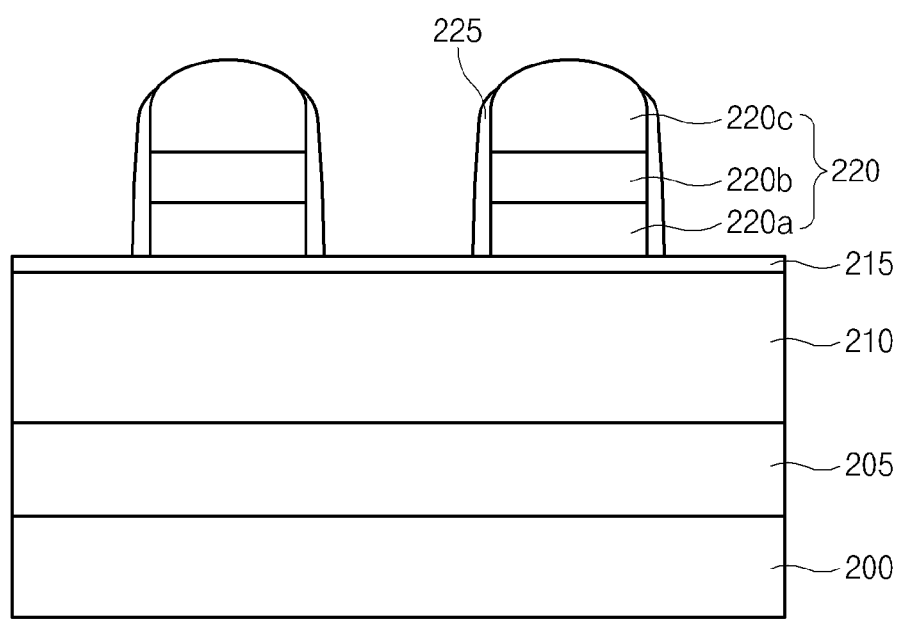
Figure 2C:
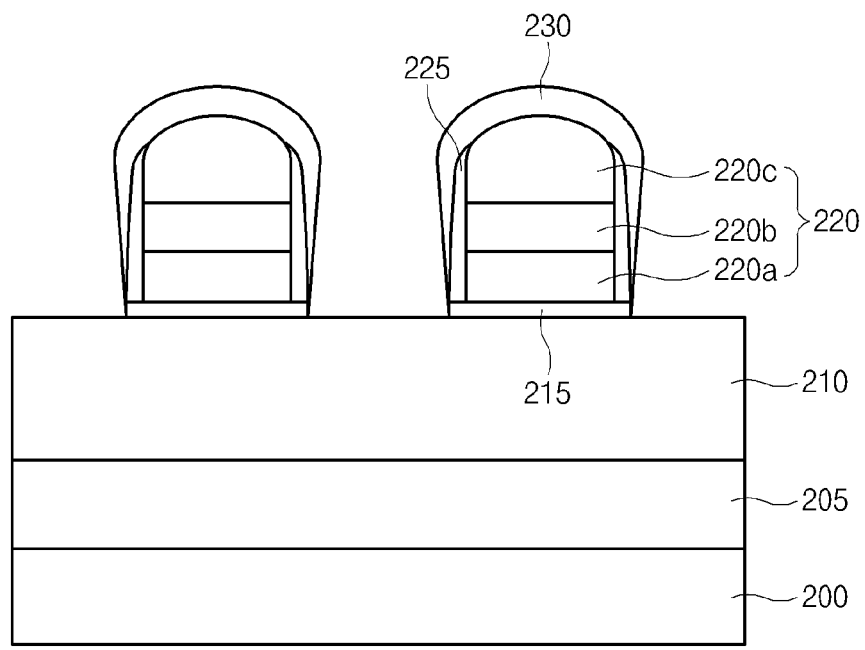

Referring to FIG. 2b, a spacer 225 is formed on each of the sidewalls of the gate pattern 220. The spacers 225 can include, for example, a nitride layer. As shown in FIG. 2c, an oxide film 230 that can protect the gate pattern 220 can be formed over the gate pattern 220, including the spacers 225. The oxide film 230 is preferably formed by uniformly forming an oxide layer over the gate pattern 220 including the spacers 225. A self-aligned etching process is performed on the resulting structure to form the oxide film 230 having, for example, a cap shape for protecting the upper portion of the gate pattern 220. The gate oxide film 215 is etched using the gate pattern 220 as an etching mask to expose a portion of the upper silicon layer 210.

Figure 2D:
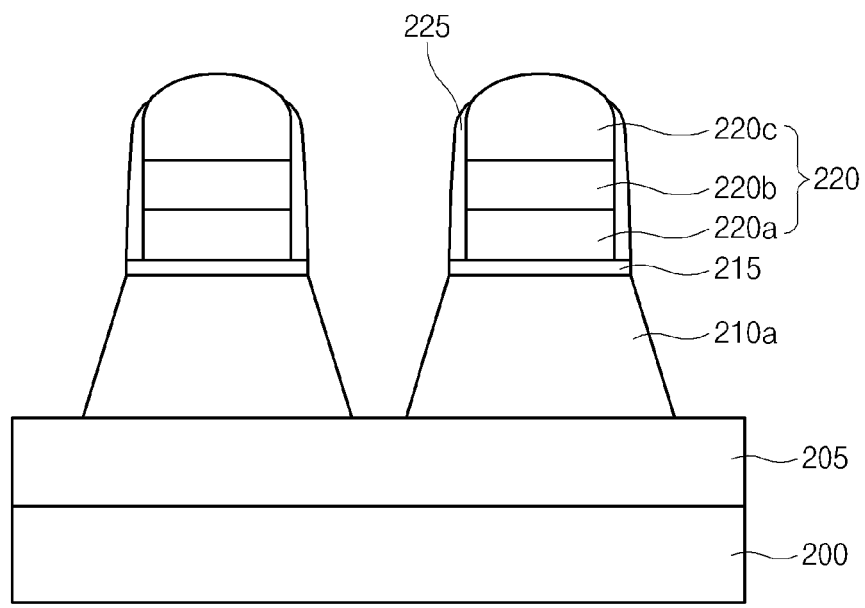

Referring to FIG. 2d, after the oxide film 230 formed over the gate pattern 220 is removed, the exposed upper silicon layer 210 is etched using the gate pattern 220 as an etching mask, to expose a portion of the insulating layer 205. As a result, a floating body 210a having, for example, a trapezoid shape is formed at the bottom of the gate pattern 220. The trapezoidal floating body 210 includes sidewalls that are not vertically aligned with that of the gate pattern 220. The insulating layer 205 can be etched slant-wise so that the lower portion of the floating body 210a is broader than the upper portion of the floating body 210a.

Figure 2E:
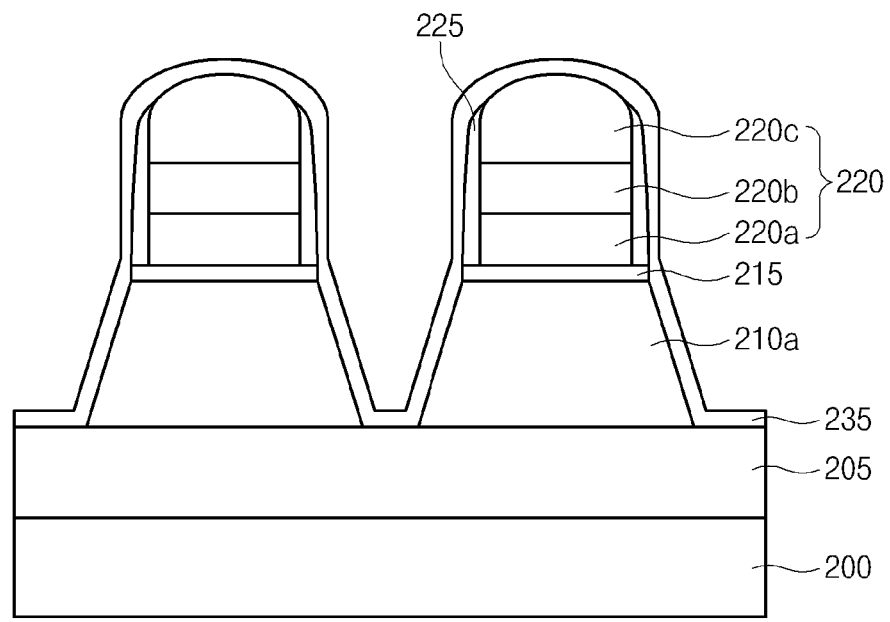

Referring to FIG. 2e, a first polysilicon layer 235 is deposited with a given thickness over the gate pattern 220 and the floating body 210a. The first polysilicon layer 235 can prevent the floating body 210a from experiencing a short channel effect caused by the excessive out-diffusion during formation of source/drain regions. The first polysilicon layer 235 includes a polysilicon layer, which is not doped with impurities.

Figure 2F:
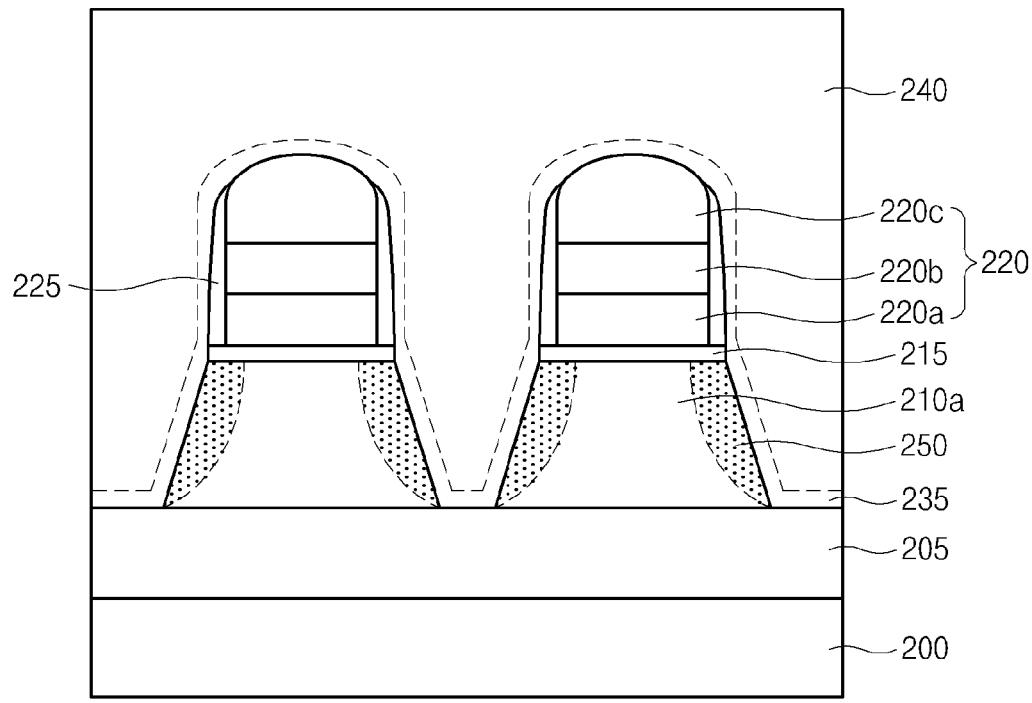

Referring to FIG. 2f, a conductive layer 240, for example a second polysilicon layer doped with impurities, is formed over the first polysilicon layer 235. A thermal treatment process is performed to diffuse the impurities included in the second polysilicon layer 240 into both the first polysilicon layer 235 and the floating body 210a in a horizontal direction, thereby isolating the transistor corresponding to the gate pattern 220 and defining source and drain regions 250 of each transistor. Preferably, the thermal treatment process is performed at about 1000° C., for about 20 seconds. The range of impurity diffusion, however, can change depending on the impurity concentration of the second polysilicon layer 240 and process conditions, such as the temperature at which the thermal process is carried out and the length of time allowed for diffusion. The first polysilicon layer 235 has a sufficient thickness for serving as a buffer layer. In detail, the first polysilicon layer 235 has a thickness substantially corresponding to the approximate range of the impurity diffusion in order to prevent the punch-through phenomenon.

The first polysilicon layer 235 is also formed so that the second polysilicon layer 240 can be filled between the neighboring floating bodies 210a. When the first polysilicon layer 235 is too thick, the second polysilicon layer 240 may not be filled between the neighboring floating bodies 110a. For example, when a distance between the bottom portions of neighboring floating bodies 110a fabricated by the sub 70 nm semiconductor process is about 50 nm to about 60 nm, the first polysilicon layer 235 can have a thickness ranging from about 50 Å to 200 Å in consideration of the impurity diffusion range and filling of a landing plug material.

Particularly, impurities are diffused from the second polysilicon layer 240 into the first polysilicon layer 235, which includes an undoped polysilicon surrounding the floating body 210a, as shown in FIG. 2f, during the thermal treatment. Accordingly, the first polysilicon layer 235 and the second polysilicon layer 240 are not distinct after the thermal treatment. However, unlike FIG. 1f, the first polysilicon layer 235 surrounding the floating body 210a serves as a buffer layer for preventing the excessive diffusion of impurities included in the second polysilicon layer 240.

Furthermore, a floating body transistor fabricated in a SOI substrate according to an embodiment of the invention facilitates formation of a plug and source/drain regions without formation of a local doping region, which can help prevent the punch-through phenomenon in both sides of the floating body 210a. The above-described methods of forming a semiconductor device can improve the integration and operating stability of the semiconductor device. Particularly, when the floating body transistor is used as a cell transistor in the semiconductor device, the integration of the semiconductor device can be improved.

The specific embodiments of the invention are illustrative and not limitative. Various alternatives and equivalents are possible. The invention is not limited by the type of deposition, etching, polishing, and patterning steps describe herein. Nor is the invention limited to any specific type of semiconductor device. For example, the invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a gate pattern on a substrate comprising a stacked structure including a lower silicon layer, an insulating layer, and an upper silicon layer;
   forming spacers on sidewalls of the gate pattern;
   etching the upper silicon layer using the gate pattern as a mask to form a floating body and expose a portion of the insulating layer;
   depositing a conductive layer over the gate pattern and the exposed insulating layer; and
   performing a thermal process on the conductive layer to form a source/drain region in the floating body.

2. The method according to claim 1 further comprising forming a gate oxide layer on the upper silicon layer before forming the gate pattern.

3. The method according to claim 1, wherein the spacers comprise a nitride layer.

4. The method according to claim 1 further comprising forming an oxide film over the gate pattern after forming the spacers.

5. The method according to claim 1 comprising etching the upper silicon layer using an etch-back process.

6. The method according to claim 1 further comprising forming a polysilicon layer on the gate pattern and the floating body.

7. The method according to claim 6, wherein the polysilicon layer is undoped.

8. The method according to claim 6, wherein the polysilicon layer has a thickness of about 50 Å to about 200 Å.

9. The method according to claim 1, wherein the conductive layer comprises a doped polysilicon layer.

10. The method according to claim 9, wherein the thermal process diffuses dopants of the doped polysilicon layer into the floating body.

11. A method for manufacturing a semiconductor apparatus, the method comprising:
    forming a gate pattern on a silicon on insulator substrate having a stacked structure including a lower silicon layer, an insulating layer, and an upper silicon layer;
    etching the upper silicon layer using the gate pattern as an etch mask to form a floating body under the gate pattern;
    forming an undoped polysilicon layer on the gate pattern and the floating body;
    forming a conductive layer on the undoped polysilicon layer; and
    performing a thermal process on the conductive layer to form a source/drain region.

12. The method according to claim 11, wherein forming the gate pattern comprises:
    forming a gate electrode comprising a polysilicon layer and a metal layer on the silicon on insulator substrate;
    forming a gate hard mask layer on the gate electrode; and
    forming a spacer on sidewalls of the gate electrode and the gate hard mask layer.

13. The method according to claim 12, wherein the spacer comprises a nitride layer.

14. The method according to claim 11 further comprising forming a gate oxide layer on the substrate before forming the gate pattern.

15. The method according to claim 14 further comprising:
    forming an oxide film over the gate pattern;
    etching the gate oxide layer using the gate pattern as an etching mask to expose a portion of the upper silicon layer; and
    removing the oxide film before etching the upper silicon layer.

16. The method according to claim 11, comprising etching the upper silicon layer using an etch-back process.

17. The method according to claim 11, wherein the pure polysilicon layer has a thickness that depends on time and temperature conditions of the thermal process and a dopant density of the doped polysilicon layer.

18. The method according to claim 17, wherein the thickness of the pure polysilicon layer ranges from 50 Å to 200 Å.

19. The method according to claim 11, wherein the conductive layer is a doped polysilicon layer.

* * * * *